United States Patent
Lee et al.

(10) Patent No.: US 6,348,375 B1
(45) Date of Patent: Feb. 19, 2002

(54) METHOD OF FABRICATING A BIT LINE STRUCTURE FOR A SEMICONDUCTOR DEVICE

(75) Inventors: Won-seok Lee; Kyoung-sub Shin, both of Seongnam; Sang-sup Jeong, Suwon, all of (KR)

(73) Assignee: Samsung Electronics Co., Ltd. (JP)

( * ) Notice: Subject to any disclaimer, the term of this patent is extended or adjusted under 35 U.S.C. 154(b) by 0 days.

(21) Appl. No.: 09/282,006

(22) Filed: Mar. 29, 1999

(30) Foreign Application Priority Data

Sep. 4, 1998 (KR) .......................................... 98-36475

(51) Int. Cl.[7] .......................................... H01L 21/8242
(52) U.S. Cl. ...................... 438/253; 438/396; 438/618; 438/636
(58) Field of Search ................ 438/253, 396, 438/262, 618, 622, 636, 424, 427, 435, 221, 296

(56) References Cited

U.S. PATENT DOCUMENTS 5,869,901 A * 2/1999 Kusuyama .................. 438/636
6,074,905 A * 6/2000 Hu et al. ..................... 438/622
6,218,292 B1 * 4/2001 Foote .......................... 438/636

FOREIGN PATENT DOCUMENTS

JP     10079430     3/1998

* cited by examiner

*Primary Examiner*—Charles Bowers
*Assistant Examiner*—Yennhu B. Huynh
(74) *Attorney, Agent, or Firm*—Cantor Colburn LLP

(57) ABSTRACT

A bit line structure for semiconductor devices, and a fabrication method thereof are provided. In this method, a first conductive film pattern, which fills a first contact hole and is used as a bit line, is formed on a first dielectric film pattern having the first contact hole formed on a semiconductor substrate. A lower part protecting layer pattern, comprised of an anti-reflectance coating (ARC) layer used in a process for patterning the first dielectric layer pattern, is formed on the interface between the first conductive layer pattern and the first dielectric layer pattern. A spacer for covering the sidewall of the first conductive film pattern is formed. An upper part protecting layer pattern comprised of an upper ARC layer is formed to cover the upper part of the first conductive layer pattern. A second dielectric layer pattern having a second contact hole is formed to cover the first conductive layer pattern. A second conductive layer pattern filling the second contact hole is formed and used as a storage node of a capacitor.

6 Claims, 6 Drawing Sheets

METHOD OF FABRICATING A BIT LINE STRUCTURE FOR A SEMICONDUCTOR DEVICE

BACKGROUND OF THE INVENTION

1. Field of the Invention

The present invention relates to a semiconductor device, and more particularly, to a bit line structure in wiring structures and a fabrication method thereof.

2. Description of the Related Art

With an increase in the integration of semiconductor devices, a critical dimension decreases. Control of the uniformity of a critical dimension becomes more and more important, thus increasing use of an anti-reflectance coating (ARC) film in a photolithographic process for patterning a material film on a semiconductor substrate. The ARC film has been necessarily adopted in a process for patterning a conductive film which is used as a wiring structure such as a bit line, etc.

The ARC film is formed on a material film to be patterned and suppresses diffused reflection on the surface of the material film. Since the diffused reflection on the surface of the material film is suppressed, accuracy by the photolithography can increase. Therefore, a more minute and uniform material film pattern can be attained.

The ARC film must be removed after the material film under the ARC film is patterned, i.e., after a bit line is formed, since the remaining ARC film can serve as an etching stopper in a subsequent process and thus cause an etch failure or a contact hole formation failure.

FIG. 1 is a cross-sectional view showing a conventional bit line structure for a semiconductor device. Referring to FIG. 1, a bit line 60 is formed on a first dielectric layer 23. Here, the bit line 60 is comprised of conductive films, e.g., an impurity-doped polycrystalline silicon layer 61 and a tungsten silicide layer 63.

A process for forming the bit line 60 is performed as follows. First, a direct contact hole and/or a direct contact pad can be formed by patterning the first dielectric layer 23 using a photolithographic process for interposing an ARC film on it. After removing the ARC film, a conductive film used as the bit line 60 is formed on the first dielectric layer 23.

A second dielectric layer 25 covering the bit line 60 is formed after the bit line 60 is formed. The second dielectric layer 25 is patterned to form a buried contact hole 29 for exposing a semiconductor substrate 10. The buried contact hole 29 is cleaned, and another conductive layer for filling the contact hole 29, e.g., a storage node of a capacitor, is then formed. A conductive buried contact pad 31 can also be formed below the buried contact hole 29.

Here, the bit line 60 may be damaged or oxidized by a subsequent process such as a storage node cleaning or forming process. Therefore, a spacer 27 for covering the sidewall of the buried contact hole 29 is introduced to prevent damage to or oxidation of the bit line 60.

However, introduction of the spacer 27 on the sidewalls of the buried contact hole 29 substantially reduces the bottom critical dimension of the buried contact hole 29, which may cause a reduction in a process margin in a subsequent process such as a process for forming a conductive film for filling the buried contact hole 29. Also, the contact area, i.e., the interface, between the conductive film for filling the buried contact hole 29 and the lower buried contact pad 31 becomes substantially small, and thus a contact resistance can be increased.

SUMMARY OF THE INVENTION

To solve the above problems, it is an object of the present invention to provide a bit line structure for semiconductor devices, by which a buried contact hole can be formed while oxidation of a bit line is prevented, and an increase in contact resistance can be curbed since a more bottom critical dimension of the buried contact hole can be attained.

It is another object of the present invention to provide a method of fabricating a bit line structure for semiconductor devices, by which a buried contact hole can be formed while oxidation of a bit line is prevented, and an increase in contact resistance can be curbed since a more bottom critical dimension of the buried contact hole can be attained.

Accordingly, to achieve the first object, there is provided a bit line structure for semiconductor devices, comprising: a first dielectric film pattern formed on a semiconductor substrate and having a first contact hole exposing a part of the semiconductor substrate; a first conductive film pattern formed on the first dielectric film pattern, filling the first contact hole, and used as a bit line; a lower protecting layer pattern which protects the lower surface of the first conductive layer pattern on the interface between the first conductive layer pattern and the first dielectric layer pattern, and is comprised of an anti-reflectance coating (ARC) layer; a spacer on the sidewall of the first conductive film pattern; an upper protecting layer pattern which covers and protects the upper surface of the first conductive layer pattern and is comprised of an ARC layer; and a second dielectric layer pattern which insulates the first conductive film pattern, is isolated from the first conductive film pattern, and has a second contact hole for exposing the semiconductor substrate.

The spacer is formed of a nitride material selected from the group consisting of silicon nitride and silicon oxynitride. The lower protecting film pattern is a nitride-based ARC layer. The upper protecting film pattern is a nitride-based ARC layer. A second conductive film pattern for filling the second contact hole is further formed on the second dielectric film pattern.

To achieve the second object, there is provided a method of fabricating a bit line structure for semiconductor devices. In this method, a first dielectric layer is formed on a semiconductor substrate. A lower ARC layer is formed on the first dielectric layer to prevent diffused reflection on the surface of the first dielectric layer. A first dielectric layer pattern having a first contact hole exposing the semiconductor substrate is formed by patterning the lower ARC layer and the first dielectric layer. A first conductive layer for filling the first contact hole is formed on the lower ARC layer. An upper ARC layer for preventing diffused reflection on the surface of the first conductive layer is formed on the first conductive layer.

A first conductive layer pattern used as a bit line is formed by sequentially patterning the upper ARC layer, the first conductive layer, and the lower ARC layer. Also, upper and lower protecting film patterns are formed, which are respectively comprised of the upper and lower ARC layers and protect the first conductive layer pattern. Here, the upper and lower protecting film patterns are nitride-based ARC layers.

A spacer is formed on the sidewall of the first conductive layer pattern. The spacer is formed of a nitride material selected from the group consisting of silicon nitride and silicon oxynitride. A second dielectric layer pattern is formed, which covers the first conductive layer pattern, is isolated from the first conductive layer pattern, and has a second contact hole for exposing the semiconductor substrate.

After the step of forming the second dielectric layer pattern, a second conductive layer pattern for filling the second contact hole is further formed on the second dielectric film pattern.

According to the present invention, oxidation of a bit line is prevented, and a second contact hole, e.g., a buried contact hole, can be formed. Also, an additional spacer on the sidewalls of the buried contact hole can be excluded, thus a larger bottom critical dimension can be secured. Therefore, an increase in the contact resistance of a second conductive film pattern filling the buried contact hole can be prevented. Furthermore, a spacer formation process can be omitted, to simplify the bit line structure fabrication process.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
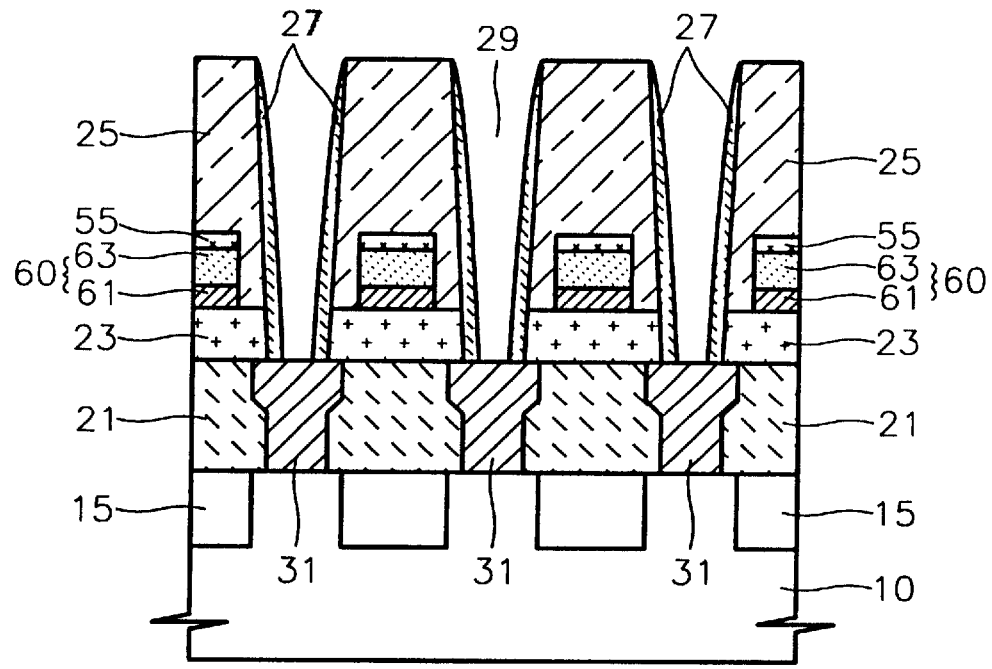
FIG. 1 is a cross-sectional view illustrating a conventional bit line structure for semiconductor devices.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

Figure 2:
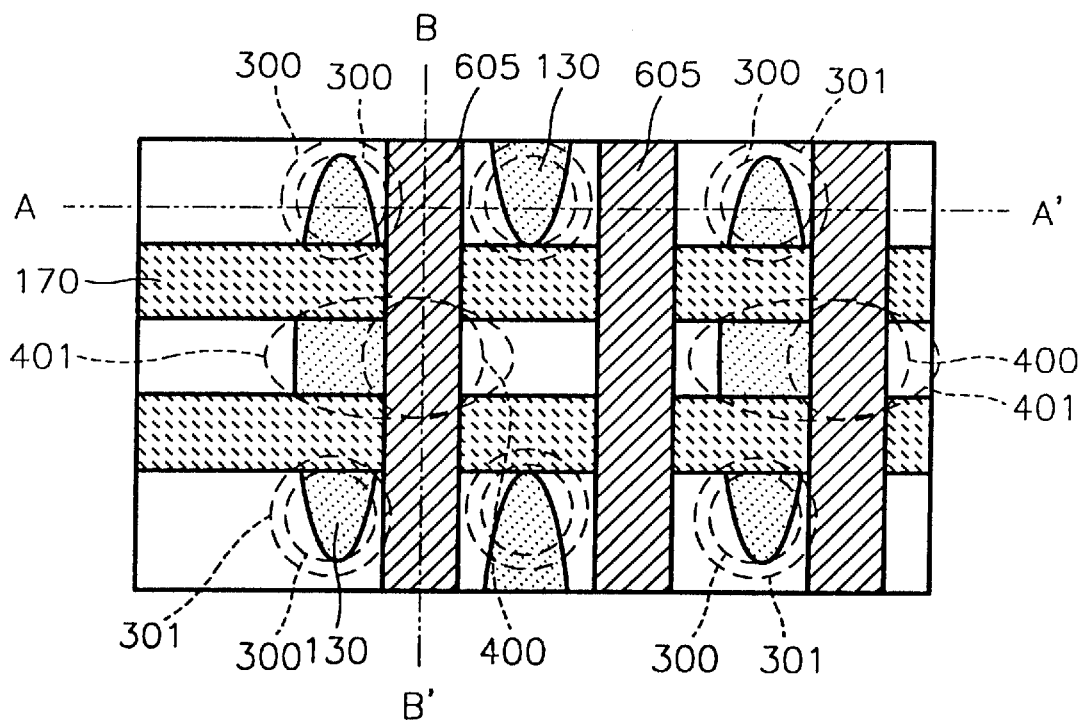
FIG. 2 is a lay-out illustrating a bit line structure according to an embodiment of the present invention.

Referring to FIG. 2, a bit line structure according to an embodiment of the present invention includes a first conductive film pattern 605 electrically connected to an active region 130 set on a semiconductor substrate 100. The first conductive film pattern 605 must be insulated from a gate electrode 170, and thus is electrically connected to the active region 130 via a contact hole and used as a bit line. For example, a first contact hole 400, e.g., a direct contact hole, is formed in a direct contact region, to thus electrically connect the active region 130 to the first conductive film pattern 605.

Another conductive film can be formed on the first conductive film pattern 605. For example, a second conductive film pattern 700 of FIG. 3 used as the storage node of a capacitor can be formed on the first conductive film pattern 605. Here, the storage node fills a second contact hole 300 formed in the buried contact region, e.g., a buried contact hole. That is, the bit line structure according to an embodiment of the present invention can be applied to a structure in which a capacitor has been formed on a bit line, i.e., a capacitor on bit line (COB) structure.

Figure 3:
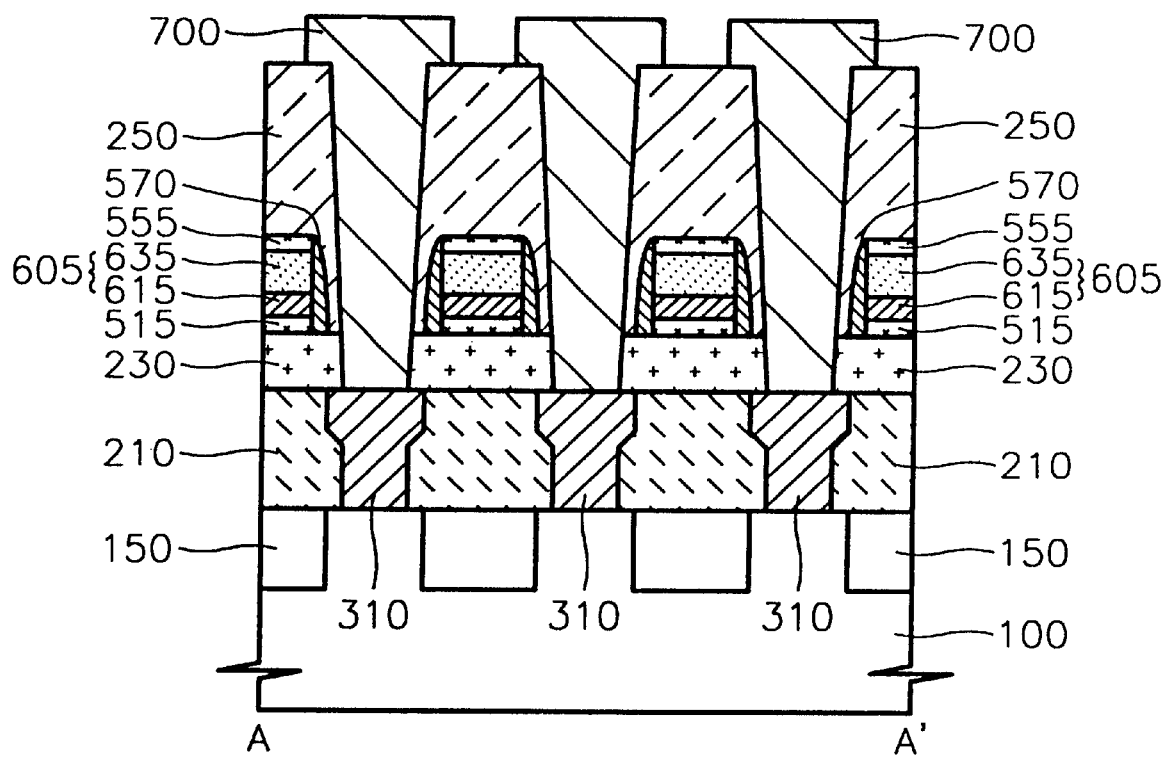
FIG. 3 is a cross-sectional view taken along line A–A' of FIG. 2, to explain a bit line structure according to an embodiment of the present invention.

Referring to FIG. 3, a first dielectric film pattern 230 having a first contact hole 400 of FIG. 2 is formed under the first conductive film pattern 605. Here, the first contact hole exposes part of a semiconductor substrate 100, e.g., the active region 130 of FIG. 2 of a direct contact region. A lower anti-reflectance coating (ARC) layer is introduced on a first dielectric film in a process for forming the first contact holes 400 of the first dielectric film pattern 230.

The lower ARC layer prevents diffused reflection on the surface of a lower film, e.g., the first dielectric film, in a photolithography process in which the first dielectric film pattern 230 is patterned, allowing formation of a minute pattern. Generally, the lower ARC layer is removed in a subsequent process. However, the embodiment of the present invention uses the lower ARC layer as a lower protecting film pattern 515 for protecting the lower part or lower surface of the first conductive film pattern 605.

That is, a first conductive film used as a bit line is formed on the lower ARC layer without being removed. The lower ARC layer is also patterned when the first conductive film is patterned, thereby forming the lower protecting film pattern 515 comprised of remaining parts of the lower ARC layer below the first conductive film pattern 605.

The lower ARC layer pattern 515 protects the first conductive film pattern 605 from a subsequent process. The protection of the first conductive film pattern 605 from a subsequent process is completely achieved by a spacer 570 for covering the sidewall of the first conductive film pattern 605 and an upper protecting film pattern 555 comprised of an upper ARC layer introduced when the first conductive film pattern 605 is patterned. At this time, the spacer 570, the upper protecting film pattern 555, and the lower protecting film pattern 515 are connected to one another, and thus better protection of the first conductive film pattern 605 is achieved.

Oxidation of or damage to the first conductive film pattern 605 in a subsequent high temperature process can be prevented by the lower protecting film pattern 515, the upper protecting film pattern 555, and the spacer 570. For example, the first conductive film pattern 605 can be prevented from being damaged or oxidized by a process for forming a second contact hole 300 (see FIG. 2) such as a subsequent buried contact hole, a process for forming a second conductive film pattern 700 used as a storage node for filling the second contact hole 300, or a dielectric film forming process. To be more specific, the first conductive film pattern 605 can be prevented from being oxidized or damaged by a cleaning process introduced to form the second conductive film pattern 700, a high temperature process, or an etch process for forming the second contact hole 300.

The upper and/or lower ARC layer can be formed of a material which is usually used to form an ARC layer, e.g., a nitride-based material. To be more specific, a silicon oxy nitride (SiON) layer as the nitride-based material can be used. Accordingly, it is preferable that the spacer 515 is formed of silicon nitride (SiN), or SiON in consideration of the interface or connection with or to the upper or lower protecting film pattern 555 or 515.

The protection of the first conductive film pattern 605 used as the bit line from a subsequent process will be described in more detail while explaining a method of fabricating a bit line structure according to an embodiment of the present invention.

Figure 4A:
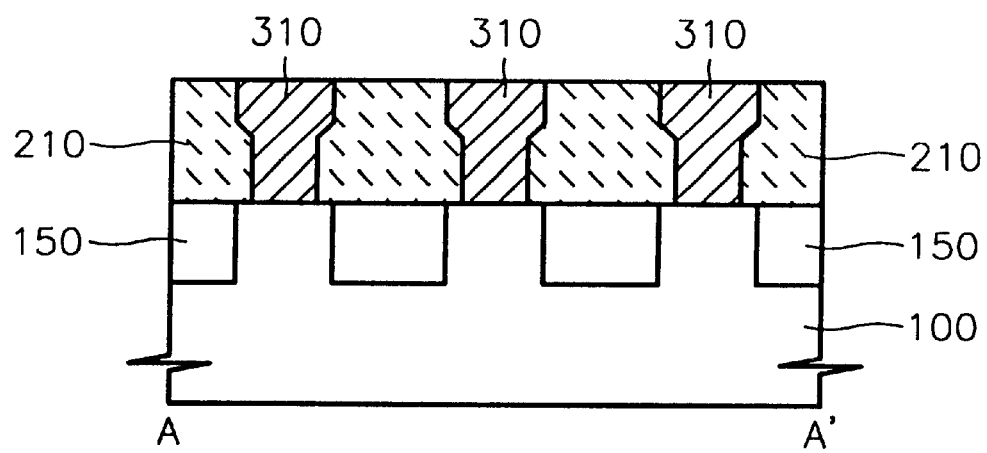
FIGS. 4A and 4B are cross-sectional views, respectively, taken along lines A–A' and B–B' of FIG. 2, illustrating the step of forming a conductive pad on a semiconductor substrate.
Figure 4B:
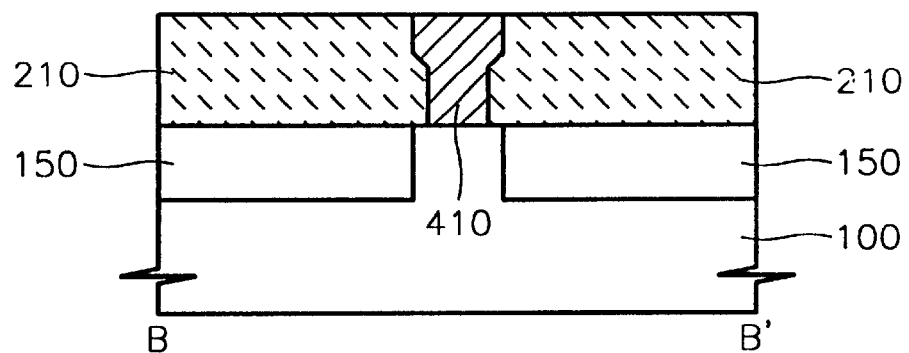

Referring to FIGS. 4A and 4B, an isolation film 150 for setting the active region 130 of FIG. 2 is formed on a semiconductor substrate 100. A third dielectric film 210 is formed using an interlayer dielectric (ILD) film covering the semiconductor substrate 100. The third dielectric film 210 is patterned to form a contact hole exposing the active region, e.g., a buried contact hole 301 of FIG. 2 in a buried contact region, or a direct pad contact hole 401 of FIG. 2 in a direct contact region.

Conductive pads 310 and 410 for improving contact characteristics are formed using the lower film of the first or second conductive film pattern 605 of FIG. 2 or 700 of FIG. 3 respectively used as a bit line or a storage node. For example, a buried contact pad 310 for filling the buried contact hole, or a direct contact pad 410 for filling the direct contact hole is formed.

Figure 5A:
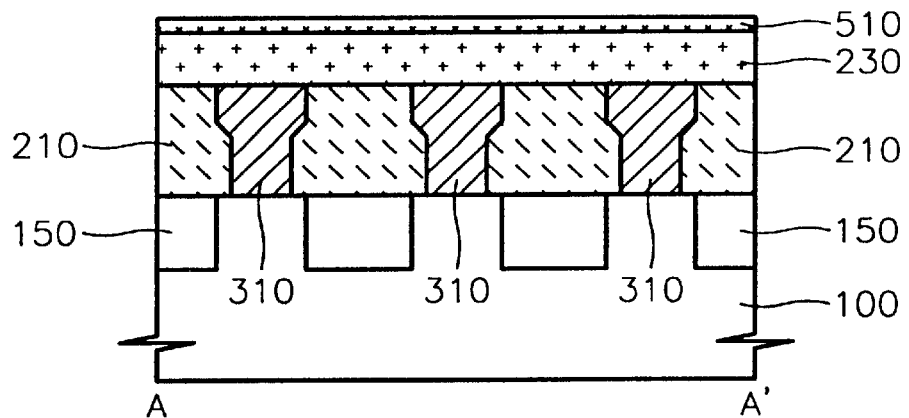
FIGS. 5A and 5B are cross-sectional views, respectively, taken along lines A–A' and B–B' of FIG. 2, illustrating the step of forming a first contact bole which is used as a direct contact hole for exposing a direct contact pad.
Figure 5B:
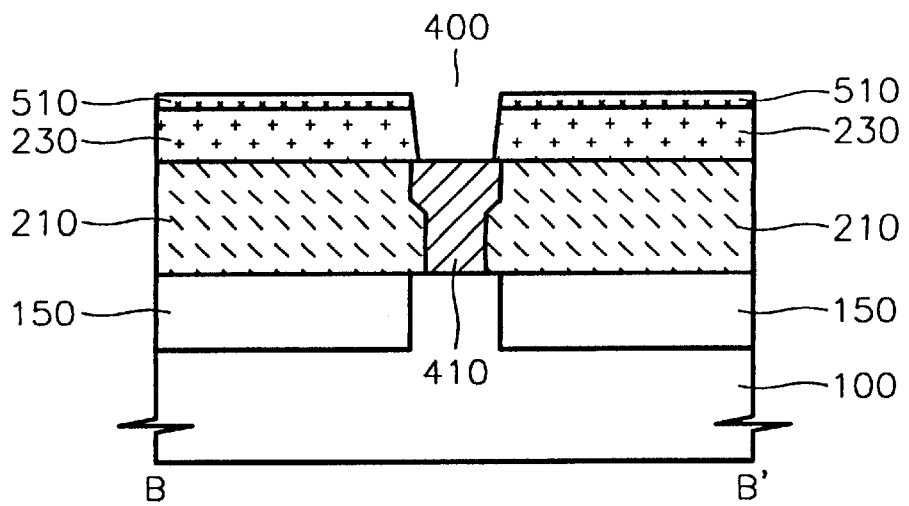

Referring to FIGS. 5A and 5B, a first dielectric film 230 is formed of a dielectric material on the third dielectric film 210. A lower ARC layer 510 is formed on the first dielectric film 230. The lower ARC layer 510 can prevent diffused reflection on the surface of the first dielectric film 230 in a photolithography process employed to pattern the first dielectric film 230. Thus, a photoresist pattern of finer dimensions can be formed.

Any general ARC layer can be used as the lower ARC layer 510, but a nitride-based ARC layer is used in consideration of the subsequent step of forming the spacer 570 of FIG. 3. For example, it is preferable that an SiON layer, etc. is used.

The first dielectric film is patterned by the above-described photolithographic process for introducing the lower ARC layer 510, to form a first contact hole 400 corresponding to a direct contact hole for exposing the surface of the direct contact pad 410. The subsequent first conductive film pattern 605 of FIG. 2 is electrically connected to the active region 130 of FIG. 2 in the semiconductor substrate 100 via the first contact hole 400. Alternatively, the first contact hole 400 may directly expose part of the semiconductor substrate 100 without inclusion of the third insulative film 210 or the direct contact pad 410.

Figure 6A:
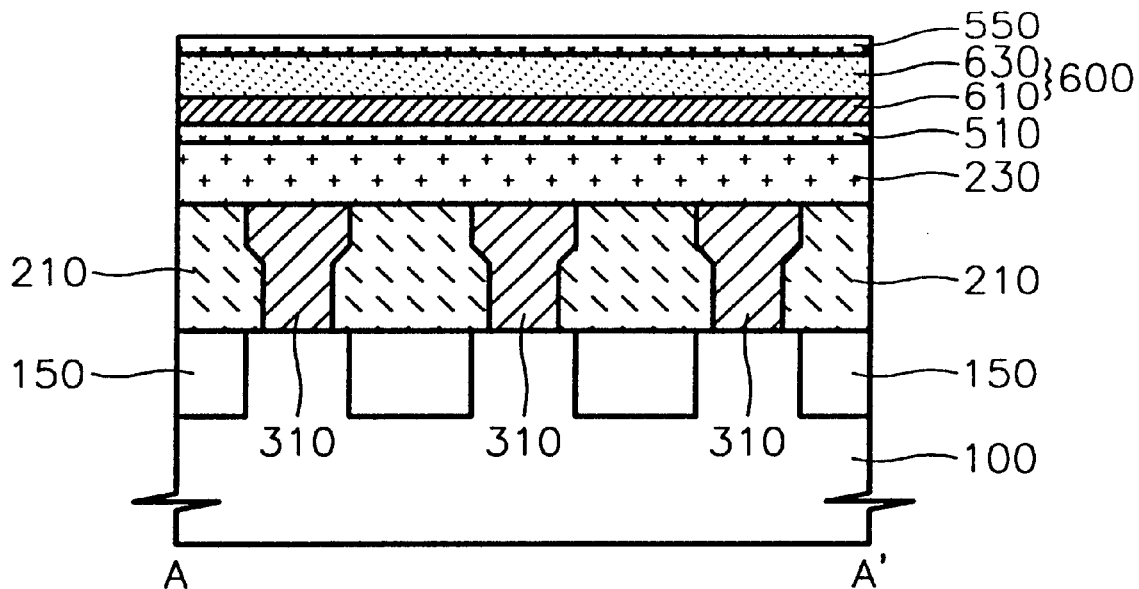
FIGS. 6A and 6B are cross-sectional views, respectively, taken along lines A–A' and B–B' of FIG. 2, illustrating the step of forming a first conductive film filling a first contact hole on a lower anti-reflectance coating layer.
Figure 6B:
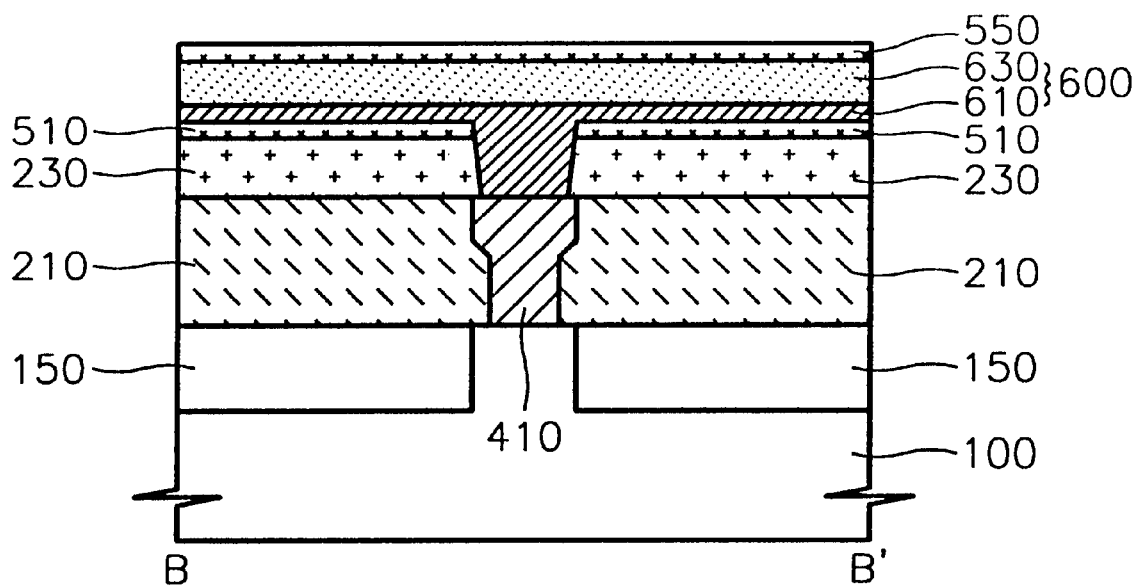

Referring to FIGS. 6A and 6B, a first conductive film 600 is formed on the lower ARC layer 510. Here, the first conductive film 600 fills the first contact hole 400 and is electrically connected to the active region 130 (see FIG. 2) of the semiconductor substrate 100. For example, an impurity-doped polycrystalline silicon film 610 filling the first contact hole 400 is formed. Then, a tungsten silicide (WSi$_x$) layer 630 is formed on the polycrystalline silicon layer 610. In this way, a first conductive layer 600 to be used as a bit line is formed.

An upper ARC layer 550 is formed on the first conductive layer 600. The upper ARC layer 550 prevents diffused reflection on the surface of the first conductive layer 600 in the photolithography process for patterning the first conductive layer 600, thereby realizing the first conductive layer pattern 605 (see FIG. 3) of fine dimension or high uniformity. Meanwhile, any ARC layer can be used as the upper ARC layer 550, but a nitride-based ARC layer is used in consideration of the step of forming the spacer 570 of FIG. 3. For example, it is preferable that an SiON layer is used.

Figure 7A:
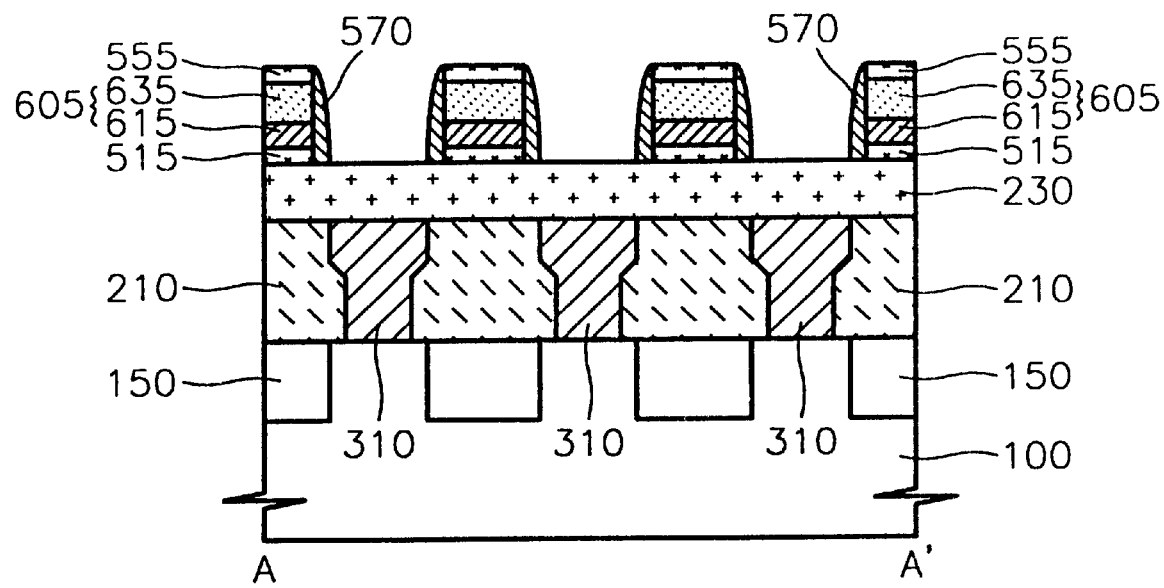
FIGS. 7A and 7B are cross-sectional views, respectively, taken along lines A–A' and B–B' of FIG. 2, illustrating the step of forming a first conductive film pattern by patterning a first conductive film.
Figure 7B:
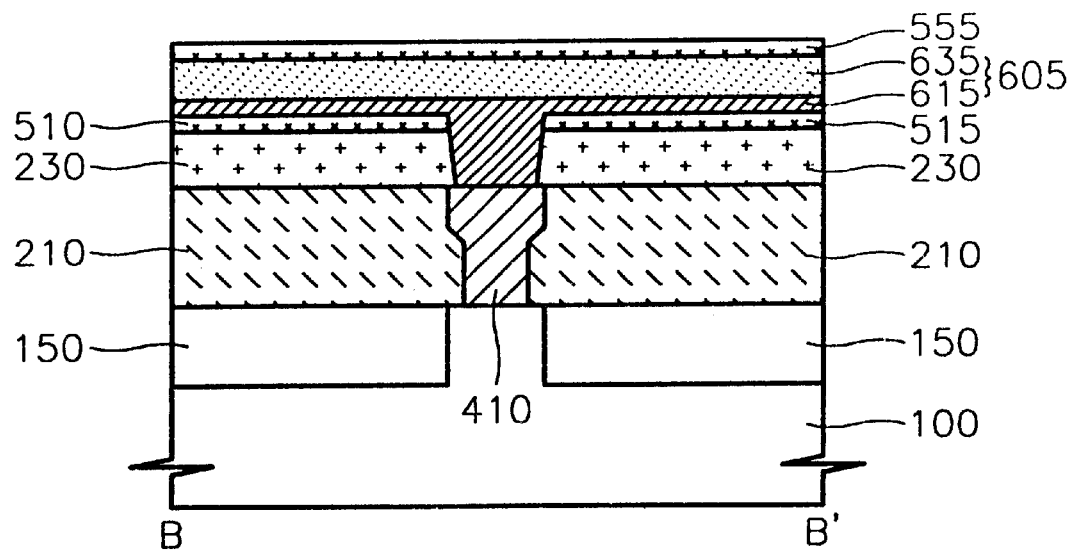

Referring to FIGS. 7A and 7B, a first conductive film pattern 605 is formed by patterning the first conductive layer 600 using the photolithographic process for including a photoresist pattern, etc. At this time, the upper or lower ARC layer 550 or 510 is also patterned, thereby forming a lower protecting layer pattern 515 which is placed on the interface between the first conductive film pattern 605 and the first dielectric film pattern 230 and comprised of the remaining part of the lower ARC layer 510. An upper protecting film pattern 555 comprised of the remaining part of the upper ARC layer 550 is also formed.

The spacer 570 is formed to cover the exposed sidewall of the first conductive film pattern 605. The spacer 570 is connected to the upper or lower protecting film pattern 555 or 515. Accordingly, the spacer 570 is formed of a material which is similar to the material of the upper or lower protecting film pattern 555 or 515, e.g., a nitride-based material. For example, the spacer 570 is an SiN or SiON layer.

As described above, the first conductive film pattern 605 is enclosed with the spacer 570, and the upper and lower protecting film patterns 555 and 515. Generation of damage to the first conductive layer pattern 605 can be better prevented. That is, when there is a high temperature process in a subsequent process, such as formation of a second conductive layer used as the storage node of a capacitor and/or formation of a dielectric layer of a capacitor, oxidation of or damage to the first conductive film pattern 605 is prevented by the spacer 570 and the upper and lower protecting film patterns 555 and 515. Therefore, an increase in the resistance of the first conductive film pattern 605 used as the bit line by oxidation, etc. is suppressed, and reliability of the bit line can thus be heightened. As a consequence, the reliability of semiconductor devices can be improved.

Meanwhile, the entire process can be simplified by introducing the lower protecting film pattern 515 as described above. For example, the lower ARC layer 510 can generally serve as an etch stopper in subsequent processes. Accordingly, an additional etch process for removing the lower ARC layer 510 must be performed after the process for patterning the first dielectric film pattern 230.

However, in the embodiment of the present invention, the lower ARC layer 510, exclusive of a portion to be used as the lower protecting film pattern 515, is simultaneously removed in the patterning process for forming the first conductive film pattern 605 used as the bit line. Thus, the additional etch process for removing the lower ARC layer 510 can be omitted, so that the entire process becomes simpler.

Figure 8A:
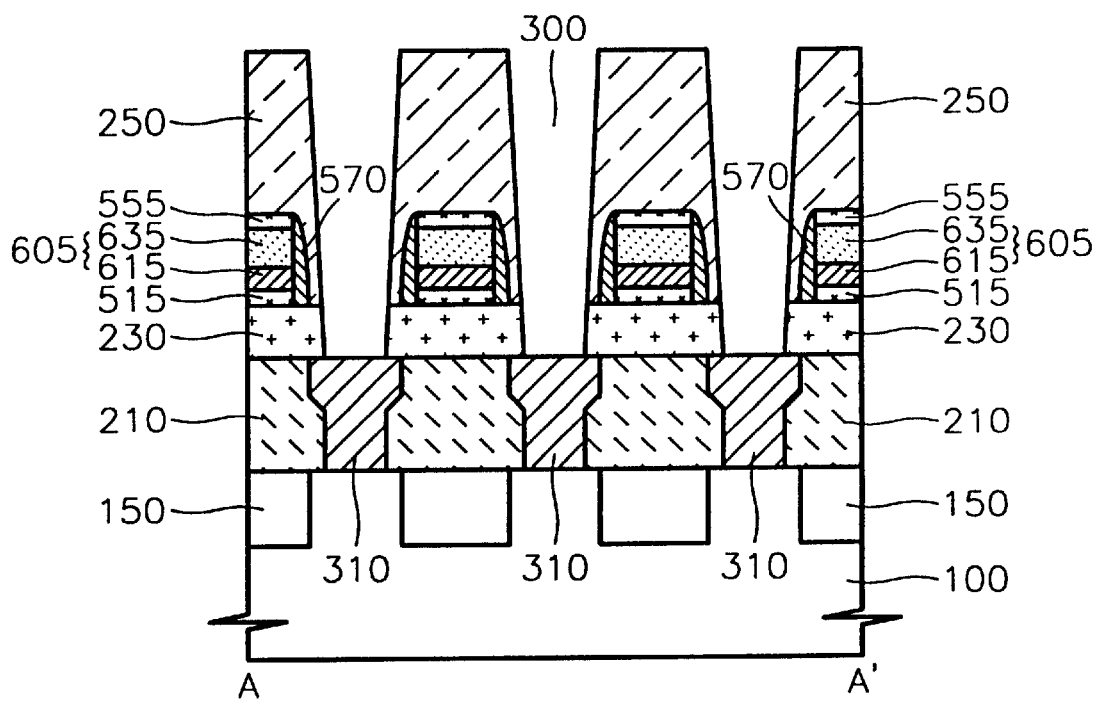
FIGS. 8A and 8B are cross-sectional views, respectively, taken along lines A–A' and B–B' of FIG. 2, illustrating the step of forming a second dielectric film having a second contact hole which is used as a buried contact hole, on a first conductive film pattern.
Figure 8B:
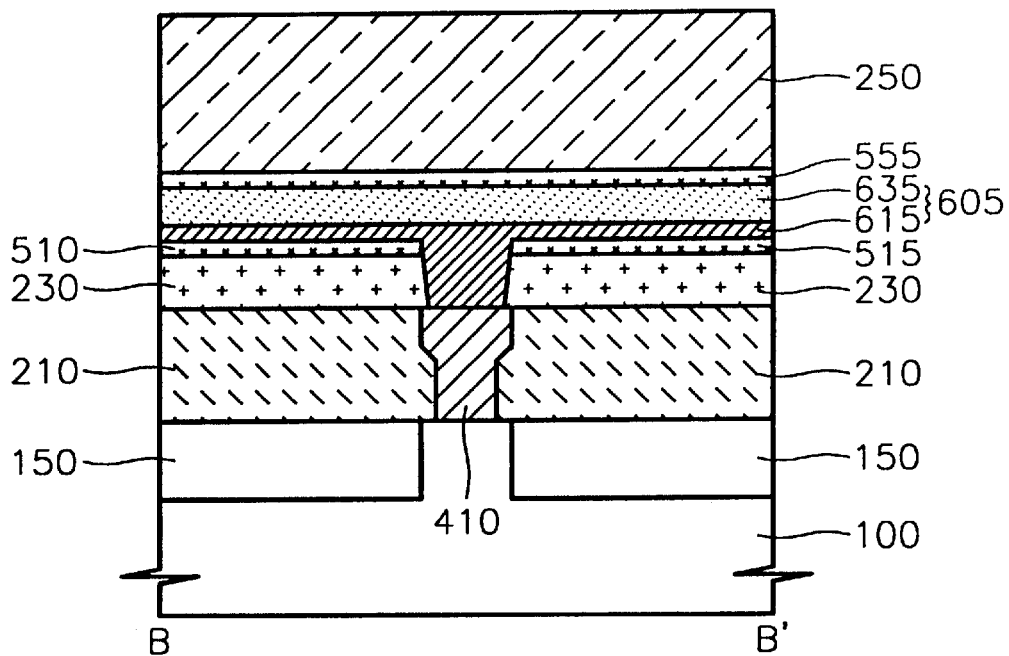

Referring to FIGS. 8A and 8B, a second dielectric film covering the first conductive film pattern 605 is formed. The second dielectric layer is patterned to form a second dielectric layer pattern 250 having a second contact hole 300 exposing the lower buried contact pad 310 or the semiconductor substrate 100.

A photolithographic process or an etch process for employing a polycrystalline silicon mask, etc. is used in the patterning process for forming the second dielectric layer pattern 250. Here, the polycrystalline silicon mask can be used as an etch mask and/or as a lower storage node stack in a subsequent process for forming a capacitor.

Then, the second conductive film pattern 700 of FIG. 3 filling the second contact hole 300 is formed. The second conductive film pattern 700 can be used as the storage node of a capacitor in a capacitor on bit line (COB) structure. Accordingly, the second conductive film pattern 700 of FIG. 3 can be formed of an impurity-doped polycrystalline silicon layer or an amorphous silicon layer. The polycrystalline silicon mask can also be adopted as a part of the storage node.

Here, the embodiment of the present invention does not require a process for forming an additional spacer for covering the sidewall of the second contact hole 300. Generally, after the second contact hole 300 is formed, an additional spacer is formed on the sidewall of the second contact hole 300 in a subsequent process, to prevent damage to the first conductive film pattern 605. However, in the embodiment of the present invention, the first conductive film pattern 605 is covered with and protected by the lower protecting film pattern 515, the spacer 570 for covering the sidewall of the first conductive film pattern 605, and the upper protecting film pattern 555. Hence, there is no need to form an additional spacer on the sidewall of the second contact hole 300, and thus the bottom dimension of the second contact hole 300 can be increased or ensured.

Also, deformation of the polycrystalline silicon mask can be prevented, which can occur in the process for forming an additional spacer covering the sidewall of the second contact hole 300. To be more specific, deformation of the polycrystalline silicon mask can be caused by a thermal process for forming a spacer on the sidewall of the second contact hole 300, e.g., by a high temperature process used to form an SiN layer. Accordingly, when the polycrystalline silicon mask is used as a part of a storage node in the subsequent process for forming a capacitor, there may be failure in a process for growing a hemispherical grained silicon layer. Thus, increasing the thickness of the polycrystalline silicon mask becomes impossible.

However, in the embodiment of the present invention, a failure in processes such as growth of the hemispherical grained silicon layer can be prevented by omitting the process for forming an additional spacer covering the sidewall of the second contact hole 300. Accordingly, the thickness of the polycrystalline silicon mask can be increased, and thus a small contact hole without a top critical dimension loss, i.e., the second contact hole 300, can be formed.

The present invention was described in detail referring to a specific embodiment, but it is not limited to the embodiment. It is apparent that modifications or improvements may be effected within the technical spirit of the present invention by those skilled in the art.

What is claimed is:

1. A method of fabricating a bit line structure for semiconductor devices, comprising:
    forming a first dielectric layer on a semiconductor substrate;
    forming a lower ARC layer on the first dielectric layer to prevent diffused reflection on a surface of the first dielectric layer;
    forming a first dielectric layer pattern having a first contact hole exposing the semiconductor substrate by patterning the lower ARC layer and the first dielectric layer;
    forming a first conductive layer for filling the first contact hole, on the lower ARC layer;
    forming an upper ARC layer for preventing diffused reflection on a surface of the first conductive layer, on the first conductive layer;
    forming a first conductive layer pattern used as a bit line by sequentially patterning the upper ARC layer, the first conductive layer, and the lower ARC layer, and upper and lower protecting film patterns which respectively comprise the upper and lower ARC layers and protect the first conductive layer pattern;
    forming a spacer on a sidewall of the first conductive layer pattern; and
    forming a second dielectric layer pattern which covers the first conductive layer pattern, is isolated from the first conductive layer pattern, and has a second contact hole for exposing the semiconductor substrate.

2. The method of fabricating a bit line structure for semiconductor devices as claimed in claim 1, wherein the lower protecting film pattern is a nitride-based ARC layer.

3. The method of fabricating a bit line structure for semiconductor devices as claimed in claim 1, wherein the upper protecting film pattern is a nitride-based ARC layer.

4. The method of fabricating a bit line structure for semiconductor devices as claimed in claim 1, wherein the spacer is formed of a nitride material selected from the group consisting of silicon nitride and silicon oxynitride.

5. The method of fabricating a bit line structure for semiconductor devices as claimed in claim 1, further comprising:
    forming a second conductive layer pattern for filling the second contact hole, on the second dielectric film pattern after forming the second dielectric layer pattern.

6. A method of fabricating a bit line structure for semiconductor devices, comprising:
    forming a first dielectric layer on a semiconductor substrate;
    forming a lower ARC layer of SiN or SiON on the first dielectric layer to prevent diffused reflection on a surface of the first dielectric layer;
    forming a first dielectric layer pattern having a first contact hole exposing the semiconductor substrate by patterning the lower ARC layer and the first dielectric layer;
    forming a first conductive layer for filling the first contact hole, on the lower ARC layer;
    forming an upper ARC layer of SiN or SiON for preventing diffused reflection on a surface of the first conductive layer, on the first conductive layer;
    forming a first conductive layer pattern used as a bit line by sequentially patterning the upper ARC layer, the first conductive layer, and the lower ARC layer, and upper and lower protecting film patterns which respectively comprise the upper and lower ARC layers and protect the first conductive layer pattern;
    forming a spacer on a sidewall of the first conductive layer pattern; and
    forming a second dielectric layer pattern which covers the first conductive layer pattern, is isolated from the first conductive layer pattern, and has a second contact hole for exposing the semiconductor substrate.

* * * * *

UNITED STATES PATENT AND TRADEMARK OFFICE
CERTIFICATE OF CORRECTION

PATENT NO. : 6,348,375 B1
DATED : February 19, 2002
INVENTOR(S) : Won-seok Lee et al.

It is certified that error appears in the above-identified patent and that said Letters Patent is hereby corrected as shown below:

<u>Title page, Item [54] and Column 1, line 1,</u>
Title, after "METHOD OF" delete "FABRICATING" and insert therefor
-- MANUFACTURING --.

<u>Column 1,</u>
Line 49, before "29 is" delete "bole" and insert therefor -- hole --.

<u>Column 3,</u>
Line 34, after "contact" delete "bole" and insert therefor -- hole --.

Signed and Sealed this

Eighteenth Day of October, 2005

JON W. DUDAS
*Director of the United States Patent and Trademark Office*